(12) United States Patent
Chu et al.

(10) Patent No.: US 11,601,045 B2
(45) Date of Patent: Mar. 7, 2023

(54) ACTIVE ELECTROMAGNETIC INTERFERENCE FILTER WITH DAMPING NETWORK

(71) Applicant: TEXAS INSTRUMENTS INCORPORATED, Dallas, TX (US)

(72) Inventors: Yongbin Chu, Plano, TX (US); Yogesh Kumar Ramadass, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/837,208

(22) Filed: Apr. 1, 2020

(65) Prior Publication Data

US 2020/0313549 A1   Oct. 1, 2020

Related U.S. Application Data

(60) Provisional application No. 62/827,699, filed on Apr. 1, 2019.

(51) Int. Cl.
| | | |
|---|---|---|
| *H02M 1/44* | (2007.01) | |
| *H03H 11/12* | (2006.01) | |
| *H02M 1/12* | (2006.01) | |
| *H02M 3/335* | (2006.01) | |
| *H02M 1/00* | (2006.01) | |

(52) U.S. Cl.
CPC ............. *H02M 1/44* (2013.01); *H02M 1/12* (2013.01); *H02M 3/33515* (2013.01); *H03H 11/1217* (2013.01); *H02M 1/0025* (2021.05); *H02M 1/123* (2021.05)

(58) Field of Classification Search
CPC .... H02M 1/44; H02M 2001/123; H02M 1/12; H02M 1/126; H03H 11/12; H03H 11/1204; H03H 11/1217
See application file for complete search history.

(56) References Cited

U.S. PATENT DOCUMENTS

| | | |
|---|---|---|
| 4,551,636 A | 11/1985 | Andrews |
| 4,667,279 A | 5/1987 | Maier |
| 4,736,152 A | 4/1988 | Albach et al. |
| 4,801,889 A | 1/1989 | Fujisawa |
| 4,878,244 A * | 10/1989 | Gawargy ............... H04B 1/586 379/402 |
| 4,952,867 A | 8/1990 | Anderson et al. |
| 5,450,622 A | 9/1995 | Vandegraaf |
| 5,452,086 A | 9/1995 | Bunn |
| 5,614,828 A | 3/1997 | Sims |
| 5,635,871 A | 6/1997 | Cavigelli |
| 5,668,464 A | 9/1997 | Krein et al. |
| 5,732,143 A | 3/1998 | Andrea et al. |
| 5,748,130 A * | 5/1998 | Wicnienski ............. H03M 1/36 341/155 |

(Continued)

*Primary Examiner* — Patrick C Chen
(74) *Attorney, Agent, or Firm* — Ray A. King; Frank D. Cimino

(57) ABSTRACT

In some examples, a circuit includes an amplifier, a resistor, and a damping network. The amplifier has an amplifier output and first and second amplifier inputs. The first amplifier input is adapted to be coupled to a first terminal, and the second amplifier input is configured to receive a reference voltage. The resistor is coupled between the amplifier output and the first amplifier input. The damping network is coupled between the amplifier output and the first terminal.

14 Claims, 3 Drawing Sheets

(56) References Cited

U.S. PATENT DOCUMENTS

| | | | |
|---|---|---|---|
| 5,889,393 A | 3/1999 | Wrathall | |
| 6,178,101 B1 | 1/2001 | Shires | |
| 6,208,134 B1 | 3/2001 | Demma | |
| 6,246,221 B1 | 6/2001 | Xi | |
| 6,292,501 B1 | 9/2001 | DuBose | |
| 6,513,383 B1 | 2/2003 | Okano et al. | |
| 7,019,503 B1 | 3/2006 | Ortiz et al. | |
| 7,038,435 B2 | 5/2006 | Ortiz et al. | |
| 7,233,130 B1 | 6/2007 | Kay | |
| 7,856,289 B2 | 12/2010 | Schanin et al. | |
| 8,704,074 B1 | 4/2014 | Liu | |
| 8,823,448 B1 | 9/2014 | Shen | |
| 8,975,887 B2 * | 3/2015 | Galbis | G05F 1/46 323/285 |
| 9,583,090 B2 | 2/2017 | Christoph | |
| 9,671,469 B2 | 6/2017 | Koduka et al. | |
| 9,705,465 B2 | 7/2017 | Bodnar et al. | |
| 9,722,484 B2 | 8/2017 | Stahl et al. | |
| 9,726,775 B2 | 8/2017 | Lamesch | |
| 9,733,275 B2 | 8/2017 | Deliwala et al. | |
| 9,734,814 B2 | 8/2017 | Christoph et al. | |
| 9,755,519 B1 | 9/2017 | Huang | |
| 9,880,574 B2 | 1/2018 | Morroni | |
| 2002/0020225 A1 | 2/2002 | Sakai et al. | |
| 2002/0105233 A1 | 8/2002 | Vice | |
| 2004/0008527 A1 | 1/2004 | Honda | |
| 2005/0237694 A1 | 10/2005 | Kapusta et al. | |
| 2006/0186955 A1 | 8/2006 | Quilter | |
| 2006/0280314 A1 | 12/2006 | Okada et al. | |
| 2008/0278229 A1 | 11/2008 | Grundl et al. | |
| 2009/0123003 A1 | 5/2009 | Sibbald | |
| 2010/0142718 A1 | 6/2010 | Chin et al. | |
| 2010/0301827 A1 | 12/2010 | Chen et al. | |
| 2013/0027011 A1 | 1/2013 | Shih et al. | |
| 2013/0207722 A1 | 8/2013 | Bulzacchelli et al. | |
| 2013/0328627 A1 | 12/2013 | Krohn | |
| 2014/0043871 A1 | 2/2014 | Shen et al. | |
| 2014/0071719 A1 | 3/2014 | Stahl et al. | |
| 2014/0292401 A1 | 10/2014 | Shen | |
| 2015/0003124 A1 | 1/2015 | Sakai et al. | |
| 2015/0041336 A1 | 2/2015 | Chan | |
| 2015/0061769 A1 | 3/2015 | Bodnar et al. | |
| 2015/0130436 A1 | 5/2015 | Kanamori | |
| 2015/0145801 A1 | 5/2015 | Angelini et al. | |
| 2015/0201277 A1 | 7/2015 | Christoph | |
| 2015/0249457 A1 | 9/2015 | Miyake | |
| 2015/0263614 A1 | 9/2015 | Bansal et al. | |
| 2015/0333712 A1 | 11/2015 | Deliwala et al. | |
| 2016/0025777 A1 | 1/2016 | Deliwala et al. | |
| 2016/0187386 A1 | 6/2016 | El-Damak et al. | |
| 2016/0259353 A1 | 9/2016 | Morroni | |
| 2016/0334818 A1 | 11/2016 | Singh et al. | |
| 2017/0077802 A1 | 3/2017 | Wei | |
| 2017/0153161 A1 | 6/2017 | Yomoyama | |
| 2017/0207713 A1 | 7/2017 | Lou et al. | |
| 2017/0345407 A1 | 11/2017 | Christoph et al. | |
| 2019/0028027 A1 * | 1/2019 | Cho | H03M 3/454 |

* cited by examiner

ACTIVE ELECTROMAGNETIC INTERFERENCE FILTER WITH DAMPING NETWORK

CROSS-REFERENCE TO RELATED APPLICATIONS

This application claims priority to U.S. Provisional Patent Application No. 62/827,699, which was filed Apr. 1, 2019, is titled "ELECTROMAGNETIC INTERFERENCE (EMI) FILTERS WITH DAMPING NETWORK," and is hereby incorporated herein by reference in its entirety.

BACKGROUND

A switched mode power supply (SMPS) transfers power from an input power source to a load by switching one or more power transistors. The transistors are coupled through a switch node/terminal to an energy storage element (such as an inductor/transformer and/or capacitor) that is capable of coupling to the load. The power transistors can be included in a power converter that includes, or is capable of coupling to, the energy storage element. An SMPS can include an SMPS controller to provide one or more gate drive signals to the power transistor(s). The switching on and off of the power transistors sometimes creates noise on a signal line, such as an input voltage line, that can present as electromagnetic interference that can at times be detrimental or undesirable.

SUMMARY

The amplifier has an amplifier output and first and second amplifier inputs. The first amplifier input is adapted to be coupled to a first terminal, and the second amplifier input is configured to receive a reference voltage. The resistor is coupled between the amplifier output and the first amplifier input. The damping network is coupled between the amplifier output and the first terminal.

In at least some examples, a system includes a power source, a filter, a power converter, and an active electromagnetic interference filter (AEF). The filter has a filter input and a filter output. The filter input is coupled to the power source. The power converter is configured to switch power from the output terminal of the filter to a load. Switching the power from the output terminal of the filter to the load, in some examples, generates noise at the power source. The AEF is coupled to the power source and comprises a damping network. The AEF is configured to reduce a magnitude of the noise. The damping network is configured to make the AEF less capacitive from a perspective of the filter.

In at least some examples, a circuit includes an AEF and a damping network coupled to the AEF. The AEF is configured to sense a noise voltage of noise at a terminal, the noise including low frequency noise components and high frequency noise components. The AEF is further configured to generate a cancellation signal according to a difference between the noise voltage and a reference voltage. The AEF is further configured to inject the cancellation signal into the terminal. The damping network is configured to make the AEF less capacitive responsive to the low frequency noise components.

DETAILED DESCRIPTION

Figure 1:
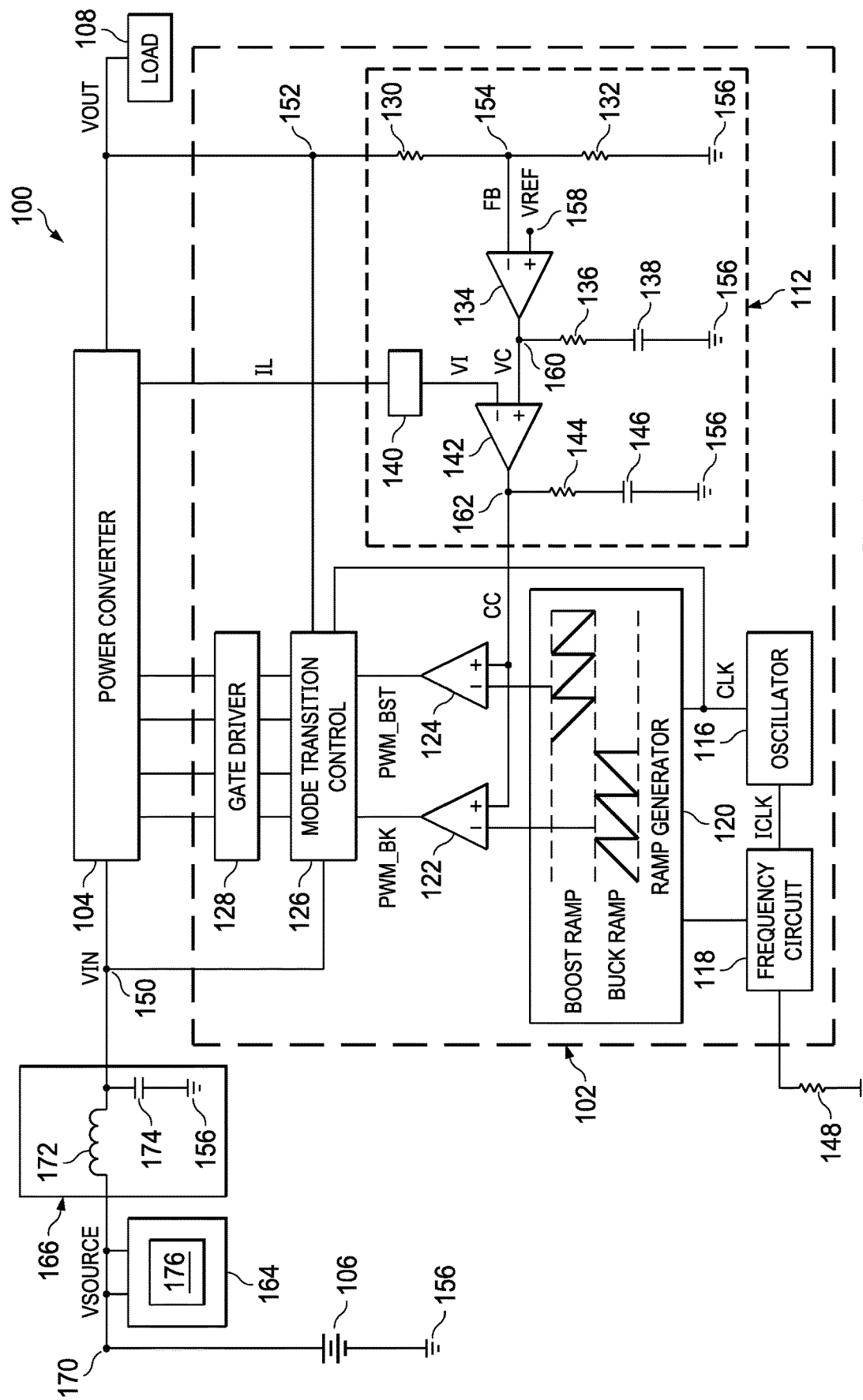
FIG. 1 shows a block diagram of an illustrative switched mode power supply (SMPS) in accordance with various examples.

In some architectures (such as buck-boost architectures), a switched mode power supply (SMPS) includes, or is capable of coupling to, an output/bulk capacitor in parallel with a load. A SMPS controller switches the power transistor (s) to form circuit arrangements with energy storage element (s) to supply a load current to the load and/or to the output/bulk capacitor to maintain a regulated output voltage (e.g., by filtering the switched load current). For example, a power transistor can be coupled through the switch node/terminal to an energy storage inductor. The energy storage inductor is switched by the SMPS controller between charge and discharge cycles to supply inductor current (e.g., current through the energy storage inductor) to the load and to the output/bulk capacitor to filter the inductor current to maintain the regulated output voltage. In some examples, an SMPS can be configured for operation as a constant current source with an energy storage element but with no output/bulk capacitor.

The power transistors can be implemented as metal oxide semiconductor field effect transistors (MOSFETs) or any other suitable solid-state transistor devices (e.g., bi-polar junction transistors (BJTs)). As an input voltage (VIN) or an output voltage (VOUT) of the power converter varies, the SMPS controller may control the power converter to operate in different modes of operation.

To control a mode of operation of the power converter, the SMPS controller provides gate control signals to one or more power transistors of the power converter. A value of each of these gate control signals determines whether a respective power transistor receiving the gate control signal is in a conductive state (e.g., turned on) or in a non-conductive state (e.g., turned off). To change a mode of operation of the power converter, the SMPS controller modifies a value of one or more of the gate control signals to turn one or more of the power transistors on or off. Also, while remaining in a mode of operation of the power converter, the SMPS controller may modify a value of one or more of the gate control signals, for example, to alternatively turn on and turn off one or more power transistors.

Generally, the SMPS controller controls the power converter to operate at a particular switching frequency. Some switching frequencies, such as high switching frequencies (e.g., greater than about 1.8 megahertz (MHz)), enable a smaller physical footprint of the power converter and/or SMPS controller by enabling the use of smaller circuit components. Other switching frequencies, such as low switching frequencies (e.g., less than about 500 kilohertz (kHz)), enable increased efficiency of a power converter by reducing switching losses of the power converter. The switching of the power transistors on and off, in at least some examples, creates noise in the SMPS and/or on a signal line, component, circuit, or device coupled to the SMPS. In some circumstances, this noise presents itself as electromagnetic interference (EMI), such as on power lines over which the SMPS receives VIN from a power source. The noise, in at least some examples, affects the power source such that other devices receiving power from the power source over other power lines may be affected by the noise. Accordingly, it is at least sometimes desirable to cancel or otherwise mitigate the noise.

Various filtering techniques exist for mitigating the noise. Some of these filtering techniques are passive, such as resistor-capacitor (RC) filters or inductor-capacitor (LC) filters. Other filtering techniques are active, such as an active EMI filter (AEF). Some implementations of an AEF include an operational amplifier that senses the noise (e.g., such as a voltage of the noise) and generates a signal (e.g., such as a cancellation voltage) to compensate for, or otherwise mitigate, the sensed noise. At low frequencies, at least some implementations of the AEF present as capacitive in nature. In some implementations, various factors such as jitter, thermal variations, and other various circuit characteristics can generate noise at low frequencies, including at a resonant frequency formed by an AEF (e.g., an equivalent capacitance of the AEF at the resonant frequency) and a filter inductor (and/or other component). In some examples, large noise current can flow through the filter inductor (and/or other component) into or out of the AEF due to this resonance, increasing power consumption of the AEF (e.g., such as of an operational amplifier of the AEF). This noise current can also saturate the operational amplifier of the AEF, degrading performance of the operational amplifier and the overall AEF. In response to the operational amplifier becoming saturated, in at least some examples the AEF is unable to mitigate the noise and its performance is degraded. Furthermore, in some examples, saturation of the operational amplifier of the AEF can cause the noise to increase in value. In various examples, regulatory bodies or other agencies or organizations specify a maximum permitted value for EMI or noise in a system in a certain frequency range, such as from about 150 kHz to about 108 MHz. In response to the AEF becoming saturated, in at least some examples, the AEF becomes unable to mitigate the noise to maintain a value of the noise below the maximum permitted value.

At least some aspects of this description provide for an AEF including a damping network. The damping network, in some examples, makes the AEF less capacitive, at least at the resonant frequency of the AEF and the filter inductor (and/or other component). In at least some examples, making the AEF less capacitive comprises increasing a phase angle of impedance of the AEF. For example, an ideal resistor has a purely real impedance component (e.g., extending in a positive direction along a horizontal axis of an impedance graph). Similarly, an ideal capacitor has a purely negative imaginary impedance component (e.g., extending in a negative direction along a vertical axis of an impedance graph). By adding a circuit element in an injection path of the AEF, with a purely real impedance component, or another circuit element having an at least partially real impedance component, a phase angle of impedance of the AEF is increased. The circuit element is, in some examples, a damping network. The increase in phase angle of the impedance of the AEF makes the AEF appear less capacitive at a node to which the AEF is coupled. In at least some implementations, the damping network includes a resistor. In other implementations, the damping network includes a resistor and a capacitor, coupled together in parallel or in series. The damping network, in various implementations, mitigates effects of the resonance on the AEF to prevent the operational amplifier of the AEF from becoming saturated. Such mitigation prevents, or reduces an effect of, degraded performance of the AEF due to the resonance of the AEF and the inductor (and/or other components) in the presence of low frequency noise components. In at least some examples, the resistor of the damping network makes the AEF less capacitive. The capacitor in turn facilitates performance of the AEF in the presence of high frequency noise. By making the AEF less capacitive (e.g., such as at least at the resonant frequency formed by the AEF and the filter inductor (and/or other components) and/or in the presence of low frequency components of the noise), effects of the resonance of the AEF and the filter inductor are reduced. Reducing the effects of resonance, in at least some examples, prevents an amplifier of the AEF from becoming saturated (e.g., prevents performance of the AEF from being degraded due to the resonance in the presence of the low frequency noise). Limiting the effects of the resonance, such as in the presence of the low frequency noise, is sometimes referred to as damping the resonance.

Some approaches exist for damping resonance, such as coupling a resistor in series with the filter inductor to damp the resonance between the AEF and the filter inductor (and/or other components). However, such an approach places the resistor in a power path of a circuit (e.g., in a power path between a VIN node and a power converter), resulting in increased power loss as current flows through the resistor. Another approach for damping resonance includes coupling a series combination of a resistor and capacitor in parallel with an AEF. However, to provide sufficient damping, the capacitor is comparatively large in capacitance and, correspondingly, in size. For example, the capacitor may have a capacitance of about 47 microfarads (uF), which for at least some implementations of electrolytic capacitors corresponds to a physical size of about 10.5 millimeters (mm)×10.5 mm×10.2 mm. Conversely, a damping network according to at least some examples and/or implementations of this description does not place a component in a power path of an SMPS. Further, a damping network according to at least some examples and/or implementations of this description includes a capacitor having a capacitance substantially less than 47 uF, and therefore smaller in size and less in cost than other approaches for damping resonance.

Referring to FIG. 1, a block diagram of an illustrative SMPS 100 is shown. In at least one example, the SMPS 100 includes a controller 102 and a power converter 104. The SMPS 100, at least through the power converter 104, switches power provided based on a power source 106 from a node 150 to a load 108. The SMPS 100 further includes, or is adapted to be coupled to, an AEF 164 via a filter 166. The power converter 104 is, for example, a buck-boost power converter that is capable of operating according to a buck mode of operation, a boost mode of operation, and a buck-boost mode of operation. In at least one example, the controller 102 includes, or is adapted to be coupled to, a feedback circuit 112, an oscillator 116, a frequency circuit 118, a ramp generator 120, a comparator 122, a comparator 124, a mode transition control circuit 126, and a gate driver 128. The SMPS 100 of this description is illustrated and described as implementing average current mode control over the power converter 104. However, other control methods are possible, such as peak current mode control, voltage mode control, or any other suitable form of control implemented in a fixed frequency or variable frequency system.

At least one example of the SMPS 100 includes at least some aspects of the controller 102, the power converter 104, and/or the AEF 164 on a same semiconductor die and/or in a same component package, while in other examples the controller 102, the power converter 104, and/or the AEF 164 may be fabricated separately and/or configured or adapted to couple together. For example, at least some aspects of the controller 102 may be fabricated separately and coupled together. Accordingly, while illustrated as including the gate driver 128, in at least one example the controller 102 does not include the gate driver 128 and instead is adapted to be coupled to the gate driver 128. Similarly, other components illustrated as being included in the controller 102 may instead be configured to couple, in whole or in part, to the controller 102 and not be included on a same semiconductor die and/or in a same component package as the controller 102.

In at least one example, the feedback circuit 112 includes a resistor 130 coupled between a node 152 and a node 154 and a resistor 132 coupled between the node 154 and a ground node 156. The feedback circuit 112 further includes an amplifier 134 having a first input terminal (e.g., a non-inverting input terminal) coupled to a node 158 and configured to receive a reference voltage (VREF) at the node 158. The amplifier 134 further has a second input terminal (e.g., an inverting input terminal) coupled to the node 154, and an output terminal coupled to a node 160. A feedback signal (FB) exists at the node 154 and is a scaled representation of VOUT, scaled according to a ratio of resistance of the resistor 132 to a total resistance of the resistor 130 and the resistor 132. A signal (VC) exists at the node 160, output by the amplifier 134 based on a difference between VREF and FB. A resistor 136 is coupled between the node 160 and a top plate of a capacitor 138 and a bottom plate of the capacitor 138 is coupled to the ground node 156. The feedback circuit 112 further includes a current sense circuit 140 and an amplifier 142. The current sense circuit 140 is adapted to be coupled to the power converter 104 to generate an output signal (VI) that is a voltage representation of a current flowing through the power converter 104. The amplifier 142 has a first input terminal (e.g., a positive or non-inverting input terminal) coupled to the node 160, a second input terminal (e.g., a negative or inverting input terminal) coupled to an output terminal of the current sense circuit 140, and an output terminal coupled to a node 162. A current control signal (CC) exists at the node 162, output by the amplifier 142 based on a difference between VC and VI. A resistor 144 is coupled between the node 162 and a top plate of a capacitor 146 and a bottom plate of the capacitor 146 is coupled to the ground node 156.

The oscillator 116, in at least some examples, is any component or components suitable for generating a clock signal, illustrated in FIG. 1 as CLK. A frequency of CLK is determined, in at least some examples, based on a value of a signal received from the frequency circuit 118. For example, the frequency circuit 118 generates a current signal, illustrated in FIG. 1 as ICLK, based at least partially on a value of a resistor 148 coupled to the frequency circuit 118. The frequency circuit 118 outputs ICLK to the oscillator 116 to enable the oscillator 116 to generate CLK at least partially according to ICLK. In at least some examples, the frequency circuit 118 further outputs ICLK to the ramp generator 120. The oscillator 116 outputs CLK to, in some examples, the ramp generator 120 and the mode transition control circuit 126.

The ramp generator 120, in at least some examples, is any component or components suitable for generating buck and boost ramp signals for use in controlling the power converter 104. In at least some examples, the buck and boost ramp signals are generated by charging and resetting (e.g., discharging) one or more capacitors (not shown) at a specified rate of charge, specified by a current value of a signal charging the one or more capacitors. In at least some examples, based on the received CLK and ICLK signals, the ramp generator 120 generates and outputs the buck ramp signal and the boost ramp signal.

The comparator 122 includes a first input terminal (e.g., a positive or non-inverting input terminal) coupled to the node 162, a second input terminal (e.g., a negative or inverting input terminal) coupled to the ramp generator 120 and configured to receive the buck ramp signal from the ramp generator 120, and an output terminal. The comparator 124 includes a first input terminal (e.g., a positive or non-inverting input terminal) coupled to the node 162, a second input terminal (e.g., a negative or inverting input terminal) coupled to the ramp generator 120 and configured to receive the boost ramp signal from the ramp generator 120, and an output terminal. In at least some examples, a control signal, illustrated in FIG. 1 as PWM_BK, exists at the output terminal of the comparator 122 and a control signal, illustrated in FIG. 1 as PWM_BST, exists at the output terminal of the comparator 124. In some examples, PWM_BK has an asserted value in response to CC being greater in value than the buck ramp and a de-asserted value in response to CC being less in value than the buck ramp. Similarly, in some examples, PWM_BST has an asserted value in response to CC being greater in value than the boost ramp and a de-asserted value in response to CC being less in value than the boost ramp.

The mode transition control circuit 126 has a plurality of input terminals configured to receive at least CLK, PWM_BK, PWM_BST, VOUT, and VIN (collectively referred to with respect to the mode transition control circuit 126 as the received signals). In at least some examples, the mode transition control circuit 126 includes or implements a state machine to generate one or more control signals for controlling the power converter 104 according to the received signals. Operation of the mode transition control circuit 126 is described in greater detail below.

The AEF 164 has an input terminal coupled to the node 170 and an output terminal coupled to the node 170. The input of the AEF 164 is, in some examples, referred to as a sense node or a sense input. The output of the AEF 164 is, in some examples, referred to as a current injection node or a current injection output. The filter 166 has an input terminal coupled to the node 170 and an output terminal coupled to the node 150. In at least some examples, the power source 106 provides a source voltage (VSOURCE) at the node 170. In at least some examples, the power converter 104 generates noise at the input node 150. The filter 166 and the AEF 164, in at least some examples, mitigate passing of noise present at the node 150 to the node 170. Such mitigation also mitigates subsequent effect(s) of noise present at the node 150 on the power source 106 (e.g., such as variation in a value of VSOURCE). Accordingly, in at least some examples the AEF 164 includes components suitable for performing active filtering, such as an amplifier (not shown) and one or more passive components (not shown). Also, in at least some examples, the filter 166 includes an inductor 172 coupled between the node 170 and the node 150 and a capacitor 174 coupled between the node 150 and the ground node 156.

In at least one example, the SMPS 100 is configured to receive VIN from the power source 106 at the node 170 and provide VOUT at the node 152 for supplying the load 108. VOUT is based at least partially on VIN as present at the node 150 and VREF as received by the SMPS 100 at the node 158. VREF may be received from any suitable device (not shown) such as a processor, microcontroller, or any other device exerting control over the SMPS 100 to control a value of VOUT. In at least one example, VREF has a value representative of a specified (e.g., user-specified, target, preconfigured, programmed, etc.) value of FB. Accordingly, in at least some implementations, the controller 102 receives one or more signals from the power converter 104. For example, the controller 102 may receive VOUT from the power converter 104 and/or an inductor current (IL) of the power converter 104. In various examples, IL may be a value directly measured from an inductor (not shown) of the power converter 104 (or a terminal of another component of the power converter 104 to which the inductor is also coupled) or a value sensed from a sense element (not shown) of the power converter 104. The sense element is, for example, a sense resistor, a transistor, or any other component or combination of components capable of measuring IL of the power converter 104 and providing a value representative of IL to the controller 102. In at least one example, the value representative of IL is provided to the feedback circuit 112 for generation of VI and VOUT is provided to the feedback circuit 112 and the mode transition control circuit 126.

In at least one example, the feedback circuit 112 is configured to receive VREF and VOUT and generate VC indicating a variation in FB from VREF. VC is referred to in some examples as an error signal. In at least some examples, FB is an output of a voltage divider formed of the resistor 130 and the resistor 132, where an input to the voltage divider is VOUT. VC is subsequently filtered by the resistor 136 and the capacitor 138 before being received by the amplifier 142. The amplifier 142, in at least one example, is configured to receive VC and VI and generate CC indicating a variation in VI from VC. CC is subsequently filtered by the resistor 144 and the capacitor 146 before being received by the comparator 122 and the comparator 124.

As described above, in at least one example, the frequency circuit 118 generates and outputs a signal ICLK based on a resistance of the resistor 148. ICLK at least partially determines a frequency of a clock signal CLK generated and output by the oscillator 116.

The mode transition control circuit 126 receives CLK, PWM_BK, PWM_BST, VOUT, and VIN and generates control signals for controlling the gate driver 128 to control the power converter 104. In at least one example, the mode transition control circuit 126 includes or otherwise implements a digital state machine to generate the control signals based on values of CLK, PWM_BK, PWM_BST, VOUT, and/or VIN.

Based on the control signals received from the mode transition control circuit 126, the gate driver 128 generates gate control signals for controlling power transistors of the power converter 104, as described above. For example, the gate driver 128 generates gate control signals that alternatingly, and selectively, turn the power transistors of the power converter on and off to energize and de-energize elements such as an inductor and/or a capacitor (each not shown). This energizing and de-energizing provides the buck, boost, and/or buck-boost functionality described herein. The gate driver 128 is implemented according to any suitable architecture, the scope of which is not limited herein.

As described above, in at least some examples, the controlling (e.g., switching) of the power transistors of the power converter 104 (e.g., the switching on and off) creates noise (e.g., such as high frequency noise above about 150 kHz) at the node 150. In the absence of the AEF 164 and the filter 166, a value of VSOURCE may be altered based on the noise at the node 150, affecting the performance of other components and/or systems not shown in FIG. 1 that also receive VSOURCE or are coupled to the power source 106. To mitigate effects of the high frequency noise (e.g., high frequency components of the noise), the AEF 164 and the filter 166 filter out the high frequency noise. The noise created by the power converter 104 further includes low frequency noise (e.g., low frequency components of the noise). In at least some examples, the low frequency noise is generated based on jitter associated with components of the power converter 104, thermal variations in components of the SMPS 100, and/or other circuit operational characteristics. In at least some examples, the low frequency noise can be at frequencies below about 150 kHz. In some circumstances, the inductor 172 of the filter 166 and the AEF 164 form a resonant circuit that causes resonance at frequencies below 150 kHz. The resonance, in at least some examples, causes noise current, sometimes having comparatively large values (e.g., as compared to noise current outside of resonant frequencies), to flow into the AEF 164 at frequencies around a resonant frequency. The resonant frequency is defined according to an inductance of the inductor 172 and an equivalent capacitance of the AEF 164. In response to the comparatively large noise current flowing into the AEF 164, in some examples, the operational amplifier of the AEF 164 becomes saturated, affecting and/or degrading performance of the AEF 164. To mitigate (e.g., dampen) the resonance, the AEF 164 includes a damping network 176. The damping network 176, in at least some examples, makes the AEF 164 less capacitive, as described above. Making the AEF 164 less capacitive reduces the noise current flowing into the operational amplifier of the AEF 164 due to the resonance. In at least some examples, the damping network 176 further enables a reduction in ambient noise present at the node 170 by preventing the AEF 164 from becoming saturated, as described in greater detail below with respect to the AEF 200 of FIG. 2.

Figure 2:
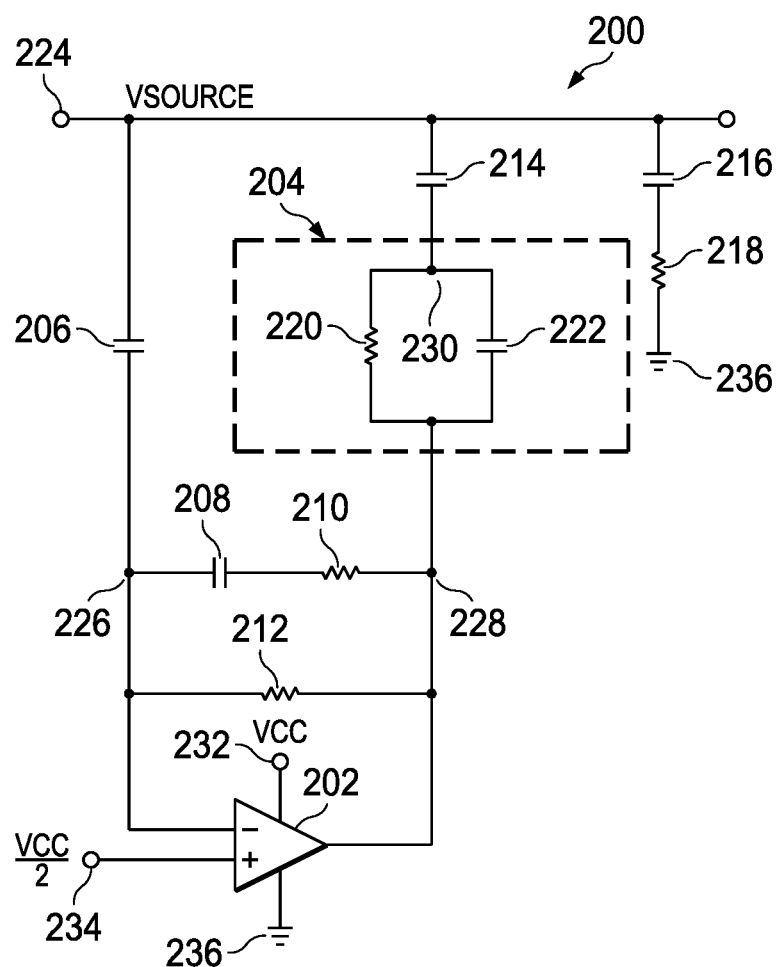
FIG. 2 shows a schematic diagram of an illustrative active electromagnetic interference filter (AEF) in accordance with various examples.

Referring to FIG. 2, a schematic diagram of an illustrative AEF 200 is shown. In at least some examples, the AEF 200 is suitable for implementation as the AEF 164 of the SMPS 100 of FIG. 1. Accordingly, reference may be made to components and/or signals of the SMPS 100 in describing the AEF 200. In other examples, the AEF 200 is suitable for implementation in any circuit, device, or system in which noise is, or may be, present and it may be desirable to actively filter that noise.

In at least one implementation, the AEF 200 includes an amplifier (e.g., such as an operational amplifier) 202 and a damping network 204 suitable for implementation as the damping network 176. At least partially because the amplifier 202 is powered by a power source, the AEF 200 is considered an active filter. This stands in opposition to passive filters that do not include a component powered by a power source (e.g., such as a filter including include only passive components such as resistors, capacitors, and/or inductors that are not powered by a power source to enable their operation). In at least some implementations, the AEF 200 further includes one or more of a capacitor 206, a capacitor 208, a resistor 210, a resistor 212, a capacitor 214, a capacitor 216, and/or a resistor 218. In at least some examples, one or more of the capacitor 206, the capacitor 208, the resistor 210, the resistor 212, the capacitor 214, the capacitor 216, and/or the resistor 218 may be omitted from the AEF 200 to reduce a surface area consumed by the AEF 200 and/or a cost of implementing the AEF 200. The components that are omitted are determined, in some examples, according to a specified function, stability, attenuation, and/or robustness of the AEF 200. In one implementation, the damping network 204 includes a resistor 220. In another implementation, the damping network 204 includes the resistor 220 and a capacitor 222.

In an example architecture of the AEF 200, the capacitor 206 is coupled between the node 224 and a node 226. The capacitor 208 and the resistor 210 are coupled in series between the node 226 and a node 228. The resistor 212 is coupled between the node 226 and the node 228. The amplifier 202 has a first input terminal (e.g., a negative or inverting input terminal) coupled to the node 226 and a second input terminal (e.g., a positive or non-inverting input terminal) coupled to a node 234. The amplifier 202 further has an output terminal coupled to the node 228. The amplifier 202 yet further has a positive supply voltage terminal coupled to a node 232 and a negative supply voltage terminal coupled to a ground node 236, which has a ground voltage potential in at least some examples, The damping network 204 is coupled in series with the capacitor 214 between the node 228 and the node 224. The capacitor 216 and the resistor 218 are coupled together in series between the node 224 and the ground node 236. The resistor 220 and the capacitor 222 are coupled in parallel between the node 228 and the node 230. In at least some examples, VSOURCE exists at the node 224 and a component supply voltage (VCC) exists at the node 232. Further, in at least some examples, a reference voltage approximately equal to VCC/2 exists at the node 234.

In at least some examples, all components of the AEF 200 are implemented on a same semiconductor die and/or in a same component package, while in other examples various components of the AEF 200 may be fabricated separately and/or configured or adapted to couple together. For example, in some implementations the damping network 204 may not be included on a same semiconductor die and/or in a same component package as one or more other components of the AEF 200. Accordingly, while illustrated as including the damping network 204, in at least one example the AEF 200 does not include the damping network 204 and instead is adapted to be coupled to the damping network 204. Similarly, other components illustrated as being included in the AEF 200, such as one or more of the capacitor 206, the capacitor 208, the resistor 210, the resistor 212, the capacitor 214, the capacitor 216, and/or the resistor 218, may instead be configured to couple, in whole or in part, to the AEF 200 and not be included on a same semiconductor die and/or in a same component package as the AEF 200. Yet further, in some examples at least some components of other devices, such as a power converter, filter, etc. may be on a same semiconductor die and/or in a same component package as at least some components of the AEF 200, such as the amplifier 202.

The capacitor 206 is, in some examples, a sense capacitor having a capacitance defined as C206 and is configured to enable the amplifier 202 to detect, at its first input terminal, noise present at the node 224. In at least some examples, C206 is in a range of about 25 nanofarads to about 100 nanofarads. The capacitor 208 is, in some examples, a compensation capacitor having a capacitance defined as C208. The resistor 210 is, in some examples, a compensation resistor having a resistance defined as R210. The resistor 212 is, in some examples, a direct current (DC) feedback resistor that provides DC feedback for the amplifier 202. In at least some examples, the resistor 212 has a resistance in a range of about 50 kiloohms to about 20 megaohms. The capacitor 214 is, in some examples, an injection capacitor having a capacitance defined as C214 and is configured to enable the amplifier 202 to inject or drive a noise cancellation signal to the node 224. In at least some examples, C214 is in a range of about 50 nanofarads to about 1 microfarad. The capacitor 216 is, in some examples, a compensation capacitor having a capacitance defined as C216. The resistor 218 is, in some examples, a compensation resistor having a resistance defined as R218. The resistor 220 is, in some examples, a damping resistor having a resistance defined as R220. The capacitor 222 is, in some examples, a damping capacitor having a capacitance defined as C222.

In an example of operation of the AEF 200, the AEF 200 is configured to sense a voltage of the noise ("noise voltage") of noise present at the node 224. In at least some examples, the noise present at the node 224 includes low frequency noise components and high frequency noise components. The AEF 200 is further configured to generate a cancellation signal according to a difference between the sensed noise voltage and the reference voltage present at the node 234. The AEF 200 is still further configured to inject the cancellation signal into the node 224.

The capacitor 206 and the capacitor 214 each couple, or are configured to couple, the AEF 200 to the node 224 via alternating current (AC) coupling (e.g., AC couple). For example, the capacitor 206 AC couples the first input terminal of the amplifier 202 to the node 224 and the capacitor 214 couples the node 230 to the node 224. The amplifier 202 senses the noise voltage present at the node 224 through the capacitor 206. Based on a difference between the sensed noise voltage and the reference voltage present at the node 234, the amplifier 202 generates the cancellation signal having an output voltage and an output current. The output current is injected into (or sunk from) the node 224 through the capacitor 214, canceling, or otherwise mitigating, at least a portion of the noise voltage and/or the sensed noise voltage. In at least some examples, the output current is instead injected into (or sunk from) the node 224 through the capacitor 214 and the damping network 204.

As described above, in at least some examples, an inductor of a filter (not shown) coupled to the AEF 200 and the AEF 200 together resonant at a frequency (often at a low frequency, such as below 150 kHz) defined according to an equivalent capacitance of the AEF 200 and an inductance of the inductor. This resonance leads to increased noise voltage (often at a low frequency, such as below 150 kHz) presented at the node 224 at the resonant frequency and/or at frequencies close to the resonant frequency. This resonance also leads to a large low frequency current flowing into the operational amplifier and, in some examples, saturates the amplifier 202 (e.g., a magnitude of the voltage present at the output terminal of the amplifier 202 and/or a magnitude of the current flowing into (or out of) the output terminal of the amplifier 202 is sufficiently high such that changes to values of input signals of the amplifier 202 will not alter the voltage and/or current present at the output terminal of the amplifier 202). In response to the amplifier 202 becoming saturated, the amplifier 202 is in a non-linear region of operation. The non-linear region of operation reduces gain of the amplifier 202 and, in some examples, clamps a value of the output voltage (and/or a value of the output current) based on a supply (not explicitly shown) powering the amplifier 202. In at least some examples, an ability of the AEF 200 to cancel the noise present at the node 224 is degraded in response to the amplifier 202 becoming saturated. Ambient noise present at the node 224, in some examples, increases due to injection of broadband noise currents into (or sunk from) the node 224 by the amplifier 202 in response to the amplifier 202 being saturated. Furthermore, while operating in the non-linear region of operation, a quiescent current of the amplifier 202 increases, in at least some implementations power consumption of the amplifier 202 and the AEF 200 increases.

In at least some examples, the damping network 204 mitigates the increased low frequency noise due to the resonance at the node 224 and thereby inhibits the amplifier 202 from becoming saturated. For example, the damping network 204 is configured to make the AEF less capacitive, such as in the presence of the low frequency noise components. To accomplish this, the damping network 204 introduces impedance having a real component in a path between the output terminal of the amplifier 202 and the node 224, making the AEF 200 appear less capacitive from a view of the node 224. This impendence having a real component between the output terminal of the amplifier 202 and the node 224 reduces the output current present at the output terminal of the amplifier 202 and/or the output voltage present at the output terminal of the amplifier 202. This reduction in output current and/or output voltage, in at least some examples, prevents the amplifier 202 from becoming saturated, thereby improving noise mitigation of the AEF.

In at least some implementations of the AEF 200, the capacitor 222 may be omitted. For example, for implementations of the AEF 200 in systems that operate at high frequencies (e.g., greater than about 2 megahertz), the capacitor 222 may be omitted such that the damping network 204 includes only the resistor 220. In other examples, the capacitor 222 is included in the damping network 204 to provide a signal path in the damping network 204 that is configured to reduce an impact of making the AEF less capacitive on operation of the AEF in the presence of the high frequency noise components. In at least one implementation of such examples, an optimal value (or approximately optimal value) of R220 is defined according to the following equation 1, in which L is an inductance of an inductor (such as the inductor 172) to which the AEF 200 is configured to couple at the node 224.

$$R220 = \sqrt{\frac{\frac{C206}{C208} * L}{C214}} \quad (1)$$

Increasing a value of R220 above an optimal value as provided for in equation 1, in at least some examples, provides a greater degree of damping in the AEF 200. However, this increased damping is at a cost of overall performance of the AEF 200, such as an increase to the equivalent impedance of the AEF 200 (e.g., in a particular frequency range or band).

In other implementations of the AEF 200, the damping network 204 includes both the resistor 220 and the capacitor 222. In at least one implementation of such examples, C222 is defined according to the following equation 2 and R220 is defined according to the following equation 3 in which L is again an inductance of an inductor (such as the inductor 172) to which the AEF 200 is configured to couple at the node 224.

$$C222 = \frac{C214}{2} \quad (2)$$

$$R220 = \frac{C206}{C208} * \sqrt{\frac{L}{\frac{C206}{C208} * C214}} \quad (3)$$

In at least some examples, the above equations 1, 2, and 3 provide optimal, or approximately optimal, component values for damping the resonance of the AEF 200 at the resonant frequency defined by the equivalent capacitance of the AEF 200 and the inductor having the inductance of L. In other examples, one or more of the equations 1, 2, and/or 3 are modified according to values of other components of the AEF 200 and/or components coupled to the AEF. This damping, in at least some examples, does not degrade (or has a negligible degrading effect on) the performance of AEF 200 at high frequencies, such as frequencies above 150 kHz. In implementations in which the damping network 204 includes both the resistor 220 and the capacitor 222, in at least some examples the resistor 220 damps the resonance at low frequencies and the capacitor 222 facilitates noise mitigation of the AEF 200 at high frequencies. For example, at a frequency of less than about $1/(2*\pi*R220*C222)$, impedance in the damping network 204 is dominated by the resistor 220. At a frequency greater than about $1/(2*\pi*R220*C222)$, impedance in the damping network 204 is dominated by the capacitor 222. In this way, the damping network 204 both damps the resonance of the AEF 200 and the inductor (and/or other components) at low frequency, and also facilitates performance of AEF 200 at high frequencies.

Figure 3:
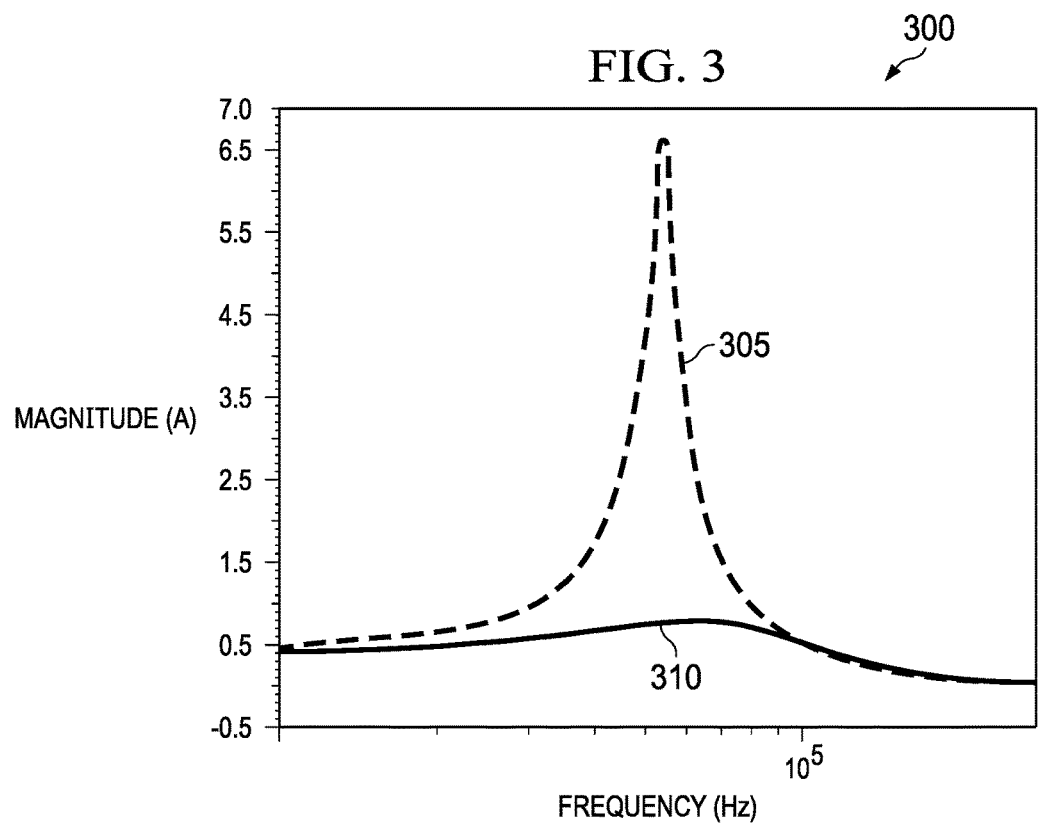
FIG. 3 shows a diagram of illustrative signal waveforms in accordance with various examples.

Referring to FIG. 3, a diagram 300 of illustrative signal waveforms is shown. In at least some examples, the diagram 300 illustrates an AC simulation of damping in an AEF, such as the AEF 200 of FIG. 2. Accordingly, reference may be made to at least some signals and/or components of the AEF 200 in describing the diagram 300. The diagram 300 illustrates damping in the AEF 200 in implementations in which the damping network 204 includes the resistor 220 and does not include the capacitor 222. A horizontal axis of the diagram 300 is representative of frequency in a unit of hertz (Hz) and a vertical axis of the diagram 300 is representative of current in a unit of amperes (A).

The diagram 300 includes two signals. Signal 305 represents current flowing into the output terminal of the amplifier 202 in the absence of the damping network 204. Signal 310 represents current flowing into the output terminal of the amplifier 202 in the presence of the damping network 204 including the resistor 220 having a resistance determined according to equation 1. Both the signal 305 and the signal 310 correspond to an assumed AC excitation having a peak current value of about 1A. As illustrated by the signal 305, in the absence of the damping network 204, a current having a peak value of about 6.5 A would flow through the output terminal of the amplifier 202 at a resonant frequency of the AEF 200 and a filter inductor, as described in greater detail above. However, as illustrated by the signal 310, in implementations in which the AEF 200 includes the damping network 204, the current flowing through the output terminal of the amplifier 202 is limited to a peak value of about 0.5 A. In this example, the resistor 220 makes the AEF 200 less capacitive, thereby damping the resonance of the AEF 200 and the filter inductor and limiting the peak current of the current flowing through the output terminal of the amplifier 202. Accordingly, in at least some examples this damping prevents saturation of the amplifier 202 and the AEF 200, as described in greater detail above.

Figure 4:
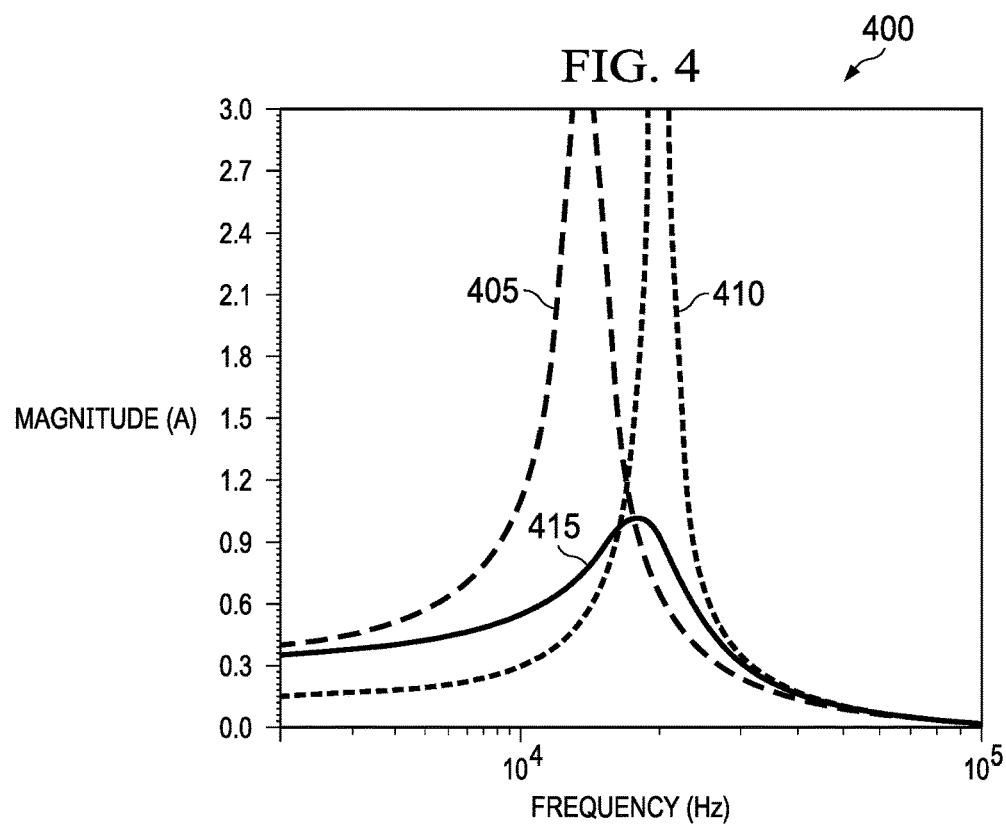
FIG. 4 shows a diagram of illustrative signal waveforms in accordance with various examples.

Referring to FIG. 4, a diagram 400 of illustrative signal waveforms is shown. In at least some examples, the diagram 400 illustrates an AC simulation of damping in an AEF, such as the AEF 200 of FIG. 2. Accordingly, reference may be made to at least some signals and/or components of the AEF 200 in describing the diagram 400. The diagram 400 illustrates damping in the AEF 200 in implementations in which the damping network 204 includes both the resistor 220 and the capacitor 222. A horizontal axis of the diagram 400 is representative of frequency in a unit of hertz (Hz) and a vertical axis of the diagram 400 is representative of current in a unit of amperes (A).

The diagram 400 includes three signals. Signal 405 represents current flowing into the output terminal of the amplifier 202 in the absence of the damping network 204. Signal 410 represents current flowing into the output terminal of the amplifier 202 in the presence of the damping network 204 in implementations in which the damping network 204 includes infinite resistance. Signal 415 represents current flowing into the output terminal of the amplifier 202 in implementations in which the damping network 204 includes both the resistor 220 and the capacitor 222, having respective resistance and capacitance values selected according to equation 3 and equation 2. Each of the signals 405, 410, and 415 correspond to an assumed AC excitation having a peak current value of about 1A. As illustrated by the signal 405, a current having a peak value greater than about 3A would flow through the output terminal of the amplifier 202 at a resonant frequency of the AEF 200 and a filter inductor, as described in greater detail above. As illustrated by the signal 410, in implementations in which the damping network 204 includes infinite resistance, a current having a peak value greater than about 3A would flow through the output terminal of the amplifier 202 at another resonant frequency of the AEF 200 and the filter inductor, as described in greater detail above. However, as illustrated by the signal 415, in implementations in which the AEF 200 includes the damping network 204 including both the resistor 220 and the capacitor 222, having respective resistance and capacitance values selected according to equation 3 and equation 2, a current having a peak value of about 0.5 A would flow through the output terminal of the amplifier 202. In this example, the resistor 220 makes the AEF 200 less capacitive, thereby damping the resonance of the AEF 200 and the filter inductor and limiting the peak current of the current flowing through the output terminal of the amplifier 202. Accordingly, in at least some examples this damping prevents saturation of the AEF 200, as described in greater detail above. At high frequencies, the capacitor 222 dominates impedance present in the damping network 204, reducing the phase angle of the impedance of the damping network of the AEF 200, thereby facilitating performance of AEF 200 at high frequencies.

While various examples and/or implementations are described herein with respect to reducing noise generated generate in a SMPS and/or by switching of power transistors in a power converter, other examples of an AEF including damping network, as disclosed herein, are applicable to noise suppression in a wide variety of applications, such as motor drives, class—D amplifiers, etc.

The term "couple" is used throughout the specification. The term may cover connections, communications, or signal paths that enable a functional relationship consistent with the description of this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components illustrated as resistors, unless otherwise stated, are generally representative of any one or more elements coupled in series and/or parallel to provide an amount of impedance represented by the illustrated resistor. For example, a resistor or capacitor illustrated and described herein as a single component may instead be multiple resistors or capacitor, respectively, coupled in parallel between the same nodes. As another example, a resistor or capacitor illustrated and described herein as a single component may instead be multiple resistors or capacitor, respectively, coupled in series between the same two nodes as the single resistor or capacitor. Also, uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

Modifications are possible in the described embodiments, and other embodiments are possible, within the scope of the claims.

What is claimed is:

1. A circuit comprising:
an amplifier having an amplifier output and first and second amplifier inputs, the first amplifier input coupled to a voltage input terminal, and the second amplifier input directly connected to a reference voltage terminal;
a feedback circuit including a first resistor and a first capacitor connected in series between the amplifier output and the first amplifier input, and a second resistor directly connected between the first amplifier input and the amplifier output;
a damping circuit having a damping circuit input and a damping circuit output, the damping circuit input directly connected to the amplifier output, the damping circuit including a third resistor and a second capacitor coupled in parallel between the damping circuit input and the damping circuit output; and a third capacitor directly connected between the damping circuit output and the voltage input terminal;

wherein the circuit is configured to generate a cancellation signal responsive to a difference between a noise voltage at the voltage input terminal and a voltage at the reference voltage terminal, and to inject the cancellation signal into the voltage input terminal.

2. The circuit of claim 1, further comprising a fourth capacitor connected between the voltage input terminal and the first amplifier input.

3. The circuit of claim 2, further comprising a fifth capacitor and a fourth resistor connected in series between the voltage input terminal and a ground terminal.

4. The circuit of claim 1, wherein the first amplifier input is an inverting input.

5. A circuit comprising:
an amplifier having an amplifier output and first and second amplifier inputs, the first amplifier input coupled to a voltage input terminal, and the second amplifier input directly connected to a reference voltage terminal;
a damping circuit having a resistor and a first capacitor connected in parallel, the resistor and the first capacitor each having respective first and second terminals, the respective first terminals of the resistor and first capacitor directly connected to the amplifier output; and
a second capacitor directly connected between the voltage input terminal and the respective second terminals of the resistor and the first capacitor;
wherein the circuit is configured to generate a cancellation signal responsive to a difference between a noise voltage at the voltage input terminal and a voltage at the reference voltage terminal, and to inject the cancellation signal into the voltage input terminal.

6. The circuit of claim 5, further comprising a third capacitor coupled between the voltage input terminal and the first amplifier input.

7. The circuit of claim 5, wherein the resistor is a first resistor, and the circuit further comprises a third capacitor and a second resistor coupled in series between the amplifier output and the amplifier input.

8. The circuit of claim 5, wherein the resistor is a first resistor, and the circuit further comprises:
a second resistor coupled between the amplifier output and the amplifier input; and
a third capacitor and a third resistor coupled in series between the amplifier output and the amplifier input.

9. A circuit comprising:
an amplifier having an amplifier output and an amplifier input;
a damping circuit including a resistor having a resistance R, and having a first resistor terminal directly connected to the amplifier output, and having a second resistor terminal;
a first capacitor having a first terminal directly connected to the second resistor terminal and having a second terminal;
a second capacitor directly connected between the second terminal of the first capacitor and the amplifier input;
a feedback circuit directly connected between the amplifier output and the amplifier input, the feedback circuit including a third capacitor; and
a filter circuit including an inductor having a first inductor terminal coupled to the second terminal of the first capacitor; wherein, $$R = \sqrt{\frac{\frac{C1}{C2} * L}{C3}},$$

where C1 is a capacitance of the second capacitor, C2 is a capacitance of the third capacitor, C3 is a capacitance of the first capacitor, and L is an inductance of the inductor.

10. The circuit of claim 9, wherein the damping circuit further includes a fourth capacitor coupled in parallel with the resistor.

11. The circuit of claim 9, wherein the inductor includes a second inductor terminal, and the filter circuit includes a fourth capacitor coupled to the second inductor terminal.

12. The circuit of claim 9, wherein the inductor includes a second inductor terminal, and the circuit further comprises a power converter having an input coupled to the second inductor terminal.

13. The circuit of claim 9, wherein the resistor is a first resistor, and the feedback circuit further includes a second resistor coupled in series with the third capacitor between the amplifier output and the amplifier input.

14. The circuit of claim 9, wherein:
the damping circuit further includes a fourth capacitor coupled in parallel with the resistor;
the fourth capacitor has a capacitance of $$C = \frac{C1}{2},$$

where C1 is a capacitance of the first capacitor; and
the resistor has a resistance of $$R = \frac{C2}{C3} * \sqrt{\frac{L}{\frac{C2}{C3} * C1}},$$

where C1 is the capacitance of the first capacitor, C2 is a capacitance of the second capacitor, C3 is a capacitance of the third capacitor, and L is an inductance of the inductor.

* * * * *